(12) United States Patent
Heid

(10) Patent No.: US 6,937,015 B2
(45) Date of Patent: Aug. 30, 2005

(54) METHOD FOR OPTIMIZING THE K-SPACE TRAJECTORIES IN THE LOCATION ENCODING OF A MAGNETIC RESONANCE TOMOGRAPHY APPARATUS

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/405,852

(22) Filed: Apr. 2, 2003

(65) Prior Publication Data

US 2003/0191386 A1 Oct. 9, 2003

(30) Foreign Application Priority Data

Apr. 3, 2002 (DE) .......................... 102 14 736

(51) Int. Cl.[7] .............................. G01V 3/00; G01B 5/05
(52) U.S. Cl. ........................ 324/307; 324/309; 324/314
(58) Field of Search ................................ 324/300–322; 600/410, 411

(56) References Cited

U.S. PATENT DOCUMENTS

| | | | | |
|---|---|---|---|---|
| 5,270,653 A | * | 12/1993 | Pauly .......................... | 324/309 |
| 5,327,088 A | * | 7/1994 | Pipe ............................ | 324/309 |
| 5,402,067 A | * | 3/1995 | Pauly et al. ................. | 324/307 |
| 5,604,435 A | * | 2/1997 | Foo et al. ................... | 324/309 |
| 6,230,039 B1 | * | 5/2001 | Stuber et al. ............... | 600/410 |
| 6,288,547 B1 | | 9/2001 | Heid .......................... | 324/322 |
| 6,483,306 B2 | | 11/2002 | Hahn ......................... | 324/307 |
| 6,636,038 B1 | * | 10/2003 | Heid .......................... | 324/314 |
| 6,801,037 B1 | * | 10/2004 | Zhang ........................ | 324/309 |
| 2003/0191386 A1 | * | 10/2003 | Heid .......................... | 600/410 |

FOREIGN PATENT DOCUMENTS

| | | |
|---|---|---|
| DE | OS 198 18 292 | 4/1998 |
| DE | OS 196 36 092 | 9/1998 |

* cited by examiner

Primary Examiner—Brij Shrivastav
Assistant Examiner—Tiffany A. Fetzner
(74) Attorney, Agent, or Firm—Schiff Hardin LLP

(57) ABSTRACT

In a method and apparatus for calculating the sampling path of the k-matrix under given boundary conditions for the examination of a subject by means of a magnetic resonance tomography apparatus having a gradient amplifier with appertaining gradient coils, an input-display terminal, a sequence controller and a system computer as well as an analog-to-digital converter, boundary conditions are entered into the sequence controller or into the system computer via the input-display terminal, the sampling path of the k-matrix is calculated taking the boundary conditions into consideration by the sequence controller or the system computer, and the gradient current curves are determined by the sequence controller or the system computer that lead to a sampling along the previously calculated sampling path when applied to the corresponding gradient coils with utilization of the ADC.

36 Claims, 5 Drawing Sheets

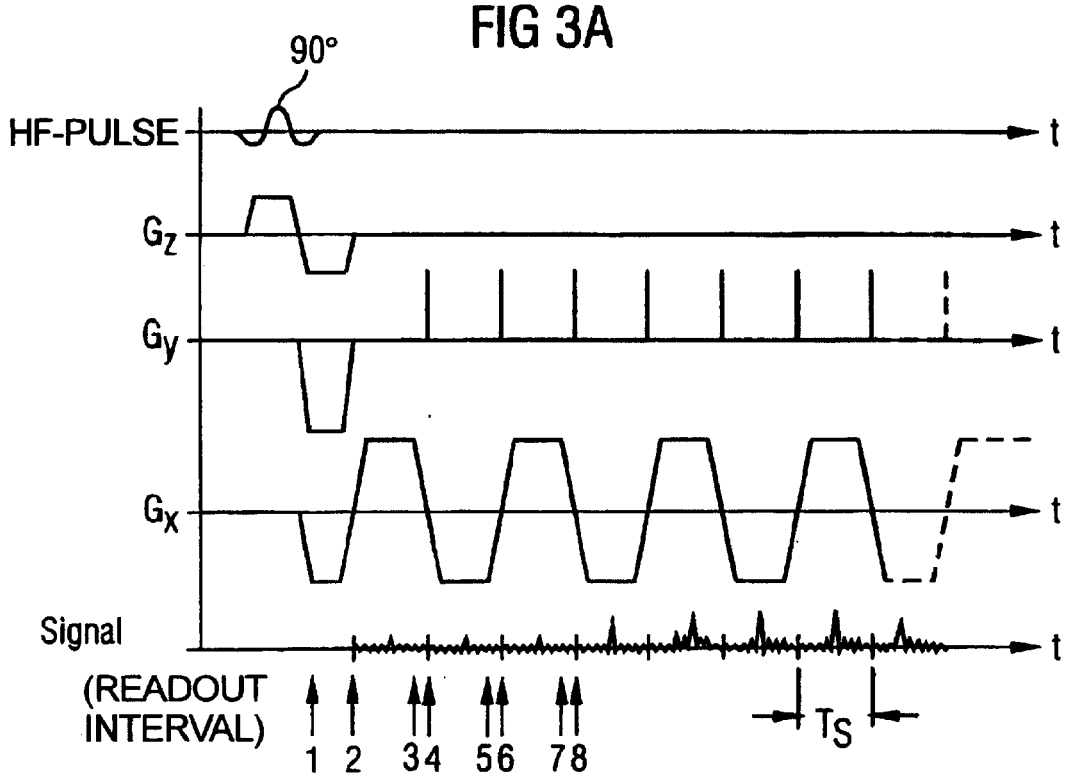
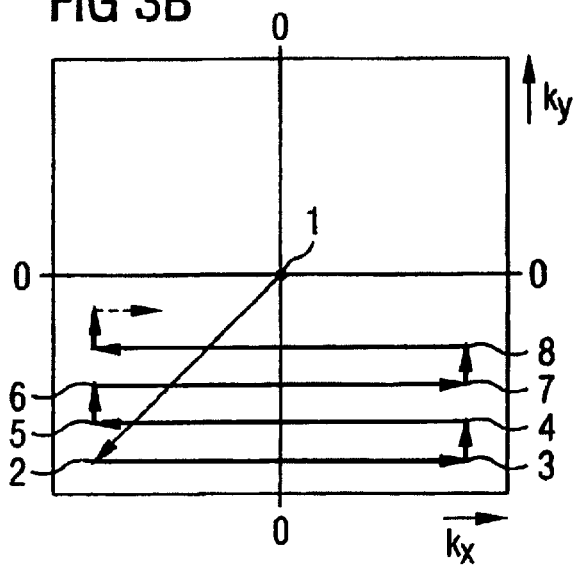

METHOD FOR OPTIMIZING THE K-SPACE TRAJECTORIES IN THE LOCATION ENCODING OF A MAGNETIC RESONANCE TOMOGRAPHY APPARATUS

BACKGROUND OF THE INVENTION

1. Field of the Invention

The present invention is directed in general to magnetic resonance tomography (MRT) as employed in medicine for examining patients. The present invention is particularly directed to a method for the optimization of k-space trajectories in the location encoding of a magnetic resonance tomography apparatus. An optimally fast sampling of k-matrix achieved as a result thereof leads to the utmost effectiveness of the sequence employed.

2. Description of the Prior Art

MRT is based on the physical phenomenon of nuclear magnetic resonance and has been successfully employed in medicine and biophysics for more than 15 years. In this examination modality, the subject is subjected to a strong, constant magnetic field. As a result thereof, the nuclear spins in the subject align, these having been previously irregularly oriented. Radiofrequency energy can then excite these "ordered" spins to a specific oscillation. This oscillation generates the actual measured signal in MRT that is picked up with suitable reception coils. By utilizing non-uniform magnetic fields, which are generated by gradient coils, the test subject can be spatially encoded in all three spatial directions, which is generally referred to as "location encoding".

The acquisition of the data in MRT ensues in k-space (frequency domain). The MRT image or spatial domain is obtained from the MRT data in k-space by means of Fourier transformation. The location encoding of the subject that k-space defines ensues by means of gradients in all three spatial directions. A distinction is made between the slice selection (defines an exposure slice in the subject, usually the Z-axis), the frequency encoding (defines a direction in the slice, usually the x-axis) and the phase encoding (defines the second dimension within the slice, usually the y-axis).

First, a slice is selectively excited, for example in the z-direction. The encoding of the location information in the slice ensues by means of a combined phase and frequency encoding with these two aforementioned, orthogonal gradient fields, which, for the example of a slice excited in z-direction, are generated by the gradient coils in the x-direction and the y-direction that have likewise already been mentioned.

FIGS. 2A and 2B show a first possible form of acquiring the data in an MRT scan. The sequence employed is a spin-echo sequence. With such a sequence, the magnetization of the spins is forced into the x-y-plane (in this example) by a slice selection gradient $G_z$ and the spins are excited by means of a 90° RF excitation pulse. Over the course of time (½ $T_E$; $T_E$ is the echo time), a dephasing of the magnetization component that together form the cross-magnetization in the x-y-plane $M_{xy}$ occurs. After a certain time (for example, ½ $T_E$), a 180° RF pulse is emitted in the x-y-plane so that the dephased magnetization components are mirrored without the precession direction and the precession times of the individual magnetization components being varied. After a further time duration TD, the magnetization components again point in the same direction, i.e. a regeneration of the cross-magnetization that is referred to as "rephasing" occurs. The complete regeneration of the cross-magnetization is referred to as spin echo.

In order to measure an entire slice of the examination subject, the imaging sequence is repeated N-times (with a repetition time TR) for various values of the phase encoding gradient, for example $G_y$, with the frequency of the magnetic resonance signal (spin-echo signal) being sampled in every sequence repetition, and is digitalized and stored N-times in equidistant time steps $\Delta t$ in the presence of the readout gradient $G_x$ by means of the $\Delta t$-clocked ADC (analog-to-digital converter). According to FIGS. 2A and 2B, a number matrix (matrix in k-space or k-matrix) with N×N data points is obtained in this way (a symmetrical matrix having N×N points is only an example; asymmetrical matrices also can be generated). An MR image of the observed slice having a resolution of N×N pixels can be directly reconstructed from this dataset by means of a Fourier transformation. Consistent with the example shown in FIG. 2A, the entries in the k-matrix shown in FIG. 2B have values $k_x$ representing the frequency coding and values $k_y$ representing the phase coding. (The same applies to FIGS. 3B and 4B discussed below.)

Another method of obtaining the k-matrix is the method of "echo planar imaging" (EPI). The basic idea of this method is to generate a series of echoes in the readout gradient ($G_x$) in a very short time after a single (selective) RF excitation, these echoes being allocated to different rows in the k-matrix by means of a suitable gradient switching (modulation of the phase encoding gradient $G_y$). All rows of the k-matrix can be acquired with a single sequence activation in this way. Different versions of the echo planar technique differ only in how the phase encoding gradients are switched, i.e. how the data points of the k-matrix are sampled.

FIG. 3A shows the ideal form of an echo planar pulse sequence using the same designations as in FIG. 2A. The needle-shaped $G_y$-pulses in the switchover time of the readout gradient $G_x$ lead to the back and forth, row-by-row traversal of the k-matrix shown in FIG. 3B, so that the measured points 1, 2, 3, 4, 5, 6, 7 and 8 (also indicated in FIG. 3A) come to lie equidistantly in the plane of k-space given a temporally uniform sampling.

The readout of the echo sequence must end at a time that corresponds to the decay of the cross-magnetization. Otherwise, the various rows of the k-matrix would be differently weighted according to the sequence of their acquisition; specific spatial frequencies would be overemphasized but others would be underemphasized. The echo planar technique makes extremely high demands on the gradient system are to the requirement for such high measurement speeds. In practice, for example, gradient amplitudes of about 25 mT/m are employed. Considerable energies must be converted in the shortest possible time, particularly for the repolarization of the gradient field; the switching times, for example, lie in the range of $\leq 0.3$ ms. For power supply, each gradient coil is connected to a gradient amplifier. Since a gradient coil represents an inductive load, correspondingly high output voltages of the gradient amplifier are required for generating the aforementioned currents, and these—as shall be explained below—do not always suffice in order to be able to measure an arbitrary slice in the inside of the basic field magnet.

Such a gradient circuit is technically realized by electronic resonant circuits with an integrated power amplifier that compensates the ohmic losses. Such an arrangement, however, leads to a sinusoidally oscillating gradient field with a constant amplitude.

An EPI pulse sequence with a sinusoidally oscillating readout gradient $G_x$ and a constant phase encoding gradient is shown in FIG. 4A (using the same designations as in FIG. 2A). Given such a sinusoidally oscillating readout gradient $G_x$, the constant phase encoding gradient $G_y$ leads to a sinusoidal sampling of the k-space, as shown in FIG. 4B (wherein data at points in time 1, 2, 3, 4, 5 and 6 from FIG. 4A are designated). A Fourier transformation by itself is no longer adequate for the later image reconstruction given a sinusoidal sampling of the k-matrix. Additional raster distortion corrections or more general integral transformations must be implemented. Given the same spatial resolution, moreover, the peak value of the gradient amplifier must be higher than for an EPI sequence with trapezoidal gradient pulses as shown in FIG. 3B.

Sequences that include trapezoidal gradient pulses therefore are conventionally employed (see FIGS. 2A, 3A). The amplitude as well as the gradient rate of change (slew rate) of these gradient pulses are based on the amplifier that is used or its performance capability. The slew rate as well as the amplitude of the applied gradient pulse are limited to a maximum value since the amplifier can only generate a specific maximum voltage, and only a limited slew rate of the gradient field can be effected at this maximum voltage due to the inductance of the gradient coil.

Since each coordinate (x-, y-, z-coordinate) has a gradient coil with an appertaining amplifier, this means that the amplitude and the slew rate for each coordinate are limited individually for that coordinate. By combining two or three gradient coils, a field can in fact be generated having an amplitude or slew rate that exceeds the limit values of the respective individual coils. Such a field, however, can be generated only on a diagonal. An individual coil is able to generate a field of this order of magnitude along the axis corresponding to it.

In practical terms for a conventional gradient pulse, this means that the plane of the k-space trajectory that is used to sample the k-matrix cannot be arbitrarily rotated in space without overloading the amplifiers of the corresponding gradient coils. In other words: not every measurement sequence defined by amplitude and slew rate of the respective gradient pulses can be arbitrarily varied such that the measurement ensues in a slice rotated relative to the gradient system without exceeding the amplitude and/or slew rate limit values. Due to the conventional employment of trapezoidal or sinusoidal gradient pulses, it is difficult to avoid, given a rotation of the measurement coordinate system relative to the coordinate system defined by the gradient field directions, exceeding the amplitude and slew rate limits—adhered to by individual pulses—due to vectorial combination.

It is thus a problem in the field of MRT to be able to sample the k-matrix optimally fast but such that the gradient current function can be subjected to an arbitrary rotation without exceeding the amplitude and/or slew rate limits of the individual coils.

SUMMARY OF THE INVENTION

An object of the present invention is to provide an MRT apparatus and method which allow an optimally fast sampling of the k-matrix in a simpler way and for every MRT apparatus without an arbitrary shift and/or rotation of the measurement plane leading to an overload of the amplifiers.

This object is achieved in accordance with the invention in an MRT apparatus and method wherein the sampling path of the k-matrix is calculated under given boundary conditions for the examination of a subject by means of MRT. Among other things, the MRT apparatus has a gradient amplifier with appertaining gradient coils, an input-display terminal, a sequence controller and a system computer as well as an analog-to-digital converter (ADC). In the inventive method and apparatus the boundary conditions are entered into the sequence controller or into the system computer via the input-display terminal.

The sampling path of the k-matrix is calculated taking the boundary conditions into consideration by the sequence controller or the system computer.

The gradient current curves are determined likewise by the sequence controller or the system computer, that lead to a sampling along the previously calculated sampling path when applied to the corresponding gradient coils upon utilization of the ADC.

Possible boundary conditions according to the invention can be:

the maximum loadability of the gradient amplifier given arbitrary rotation of the k-matrix to be sampled in the homogeneity volume of the basic field magnet (It should be noted with respect to this boundary condition that the maximum loadability of the gradient coil amplifiers can already be present in the memory of the sequence controller or of the system computer and therefore need not be separately entered.)

the spatial orientation of the k-matrix to be sampled in the examination subject the arrangement of the measuring points in the k-matrix to be sampled the sequence type of the sampling the departure and arrival speed of each measuring point of the k-matrix the sequence in which the measuring points of the k-matrix are to be sampled avoiding nerve stimulations of the examination subject by not exceeding appropriate limit values of the gradient pulses minimization of the sampling time minimization of the slew rate during the sampling.

The calculation of the sampling path can ensue by variation calculations taking all or a sub-set of the above possible boundary conditions into consideration.

Mathematically, the calculated sampling path is described two-dimensionally or three-dimensionally in suitable coordinates (for example, spherical coordinates, cylindrical coordinates).

DESCRIPTION OF THE DRAWINGS

FIG. 3A schematically shows the time curve of the gradient pulse current functions of an echo-planar imaging sequence with trapezoidal readout gradients.

FIG. 3B schematically shows the time sampling of the k-matrix for an echo-planar imaging sequence according to FIG. 2A.

DESCRIPTION OF THE PREFERRED EMBODIMENTS

Figure 5:
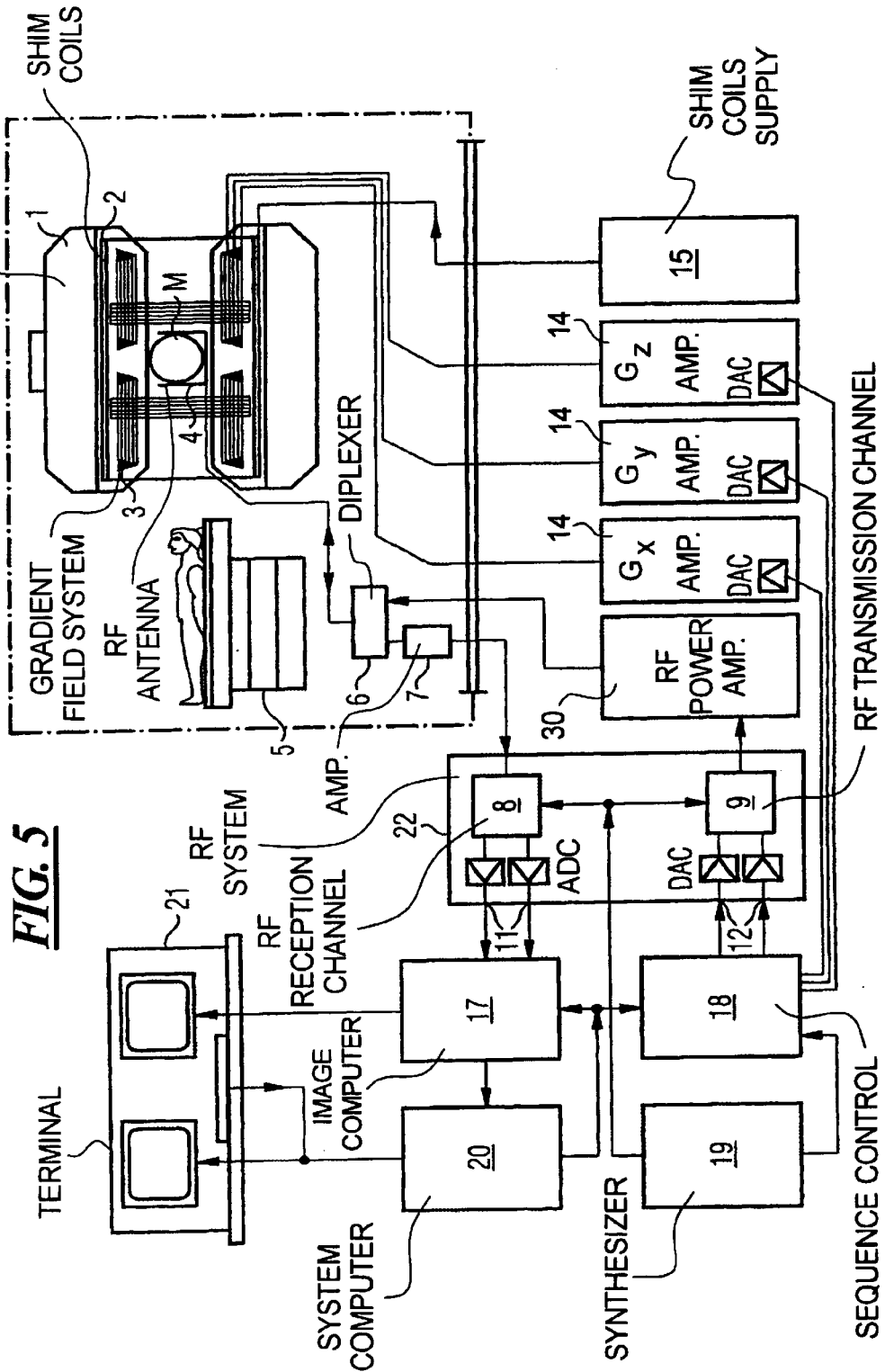
FIG. 5 schematically shows a magnetic resonance tomography apparatus operable in accordance with the invention.

FIG. 5 is a schematic illustration of a magnetic resonance tomography apparatus for generating gradient pulses according to the present invention. The structure of the magnetic resonance tomography apparatus corresponds to the structure of a conventional tomography apparatus, with the differences described below. A basic field magnet 1 generates a temporally constant, strong magnetic field for the polarization or alignment of the nuclear spins in the examination region of a subject such as, for example, a part of a human body to be examined that is disposed on a patient support 5. The high homogeneity of the basic magnetic field required for the magnetic resonance measurement is defined in a spherical measurement volume M into which the parts of the human body to be examined are introduced. For satisfying the homogeneity requirements and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three sub-windings is introduced into the basic field magnet 1. Each sub-winding is supplied with current by an amplifier 14 for generating a linear gradient field in the respective direction of the Cartesian coordinate system. The first sub-winding of the gradient field system generates a gradient $G_x$ in the x-direction, the second sub-winding generates a gradient $G_y$ in the y-direction and the third sub-winding generates a gradient $G_z$ in the x-direction. Each amplifier 14 has a digital-to-analog converter DAC that is driven by a sequence controller 18 for the temporally correct generation of gradient pulses.

A radiofrequency antenna 4 is situated within the gradient field system 3. This antenna 4 converts the radiofrequency pulse output by a radiofrequency power amplifier 30 into a magnetic alternating field for exciting the nuclei and alignment of the nuclear spins of the examination subject or of the region of the subject to be examined. The radiofrequency antenna 4 and the gradient coil system 3 are operated in a pulse sequence composed of one or more radiofrequency pulses and one or more gradient pulses. The radiofrequency antenna 4 converts the alternating field emanating from the precessing nuclear spins, i.e. the nuclear spin echo signals, into a voltage that is supplied via an amplifier 7 to a radiofrequency reception channel 8 of a radiofrequency system 22. The radiofrequency system 22 also has a transmission channel 9 in which the radiofrequency pulses for exciting the nuclear magnetic resonance are generated. The respective radiofrequency pulses are digitally represented as a sequence of complex numbers in the sequence controller 18 on the basis of a pulse sequence prescribed by the system computer 20. As a real part and an imaginary part, this number sequence is supplied via an input 12 to a digital-to-analog converter in the radiofrequency system 22 and from the latter to a transmission channel 9. In the transmission channel 9, the pulse sequences are modulated onto a high-frequency carrier signal having a base frequency corresponding to the resonant frequency of the nuclear spins in the measurement volume.

The switching from transmission mode to reception mode ensues via a transmission-reception diplexer 6. The radiofrequency antenna 4 emits the radiofrequency pulses for exciting the nuclear spins into the measurement volume M and samples resulting echo signals. The correspondingly acquired nuclear magnetic resonance signals are phase-sensitively demodulated in the reception channel 8 of the radiofrequency system 22 and converted via respective analog-to-digital ADC converters into a real part and an imaginary part of the measured signal, which are available at outputs 11 of the radiofrequency system 22. An image computer 17 reconstructs an image from the measured data acquired in this way. The management of the measured data, of the image data and of the control programs ensues via the system computer 20. On the basis of control programs, the sequence controller 18 controls the generation of the desired pulse sequences and the corresponding sampling of k-space. In particular, the sequence controller 18 controls the temporally correct switching of the gradients, the emission of the radiofrequency pulses with defined phase and amplitude as well as the reception of the magnetic resonance signals. The time base (clock) for the radiofrequency system 22 and the sequence controller 18 is made available by a synthesizer 19. The selection of corresponding control programs for generating a magnetic resonance image as well as the presentation of the generated magnetic resonance image ensue via a terminal 21 that has a keyboard as well as one or more picture screens.

The present invention is directed to finding the optimum path in the k-space matrix taking prescribed boundary conditions into consideration. To that end, the user first enters the relevant data for the MRT measurement and the boundary conditions via the terminal 21. The boundary conditions can be one or more of the maximum loadability of the gradient amplifier given arbitrary rotation of the k-matrix to be sampled in the homogeneity volume of the basic field magnet, the spatial orientation of the k-matrix to be sampled in the examination subject, the arrangement of the measuring points in the k-matrix to be sampled, the sequence type of the sampling, the departure and arrival speed of each measuring point of the k-matrix, the sequence in which the measuring points of the k-matrix are to be sampled, avoiding nerve stimulations of the examination subject by not exceeding corresponding limit values of the gradient pulses, minimization of the sampling time, minimization of the slew rate during the sampling.

On the basis of these entries, the sequence controller 18 calculates the optimum sampling path under the prescribed boundary conditions according to the method described below. The sequence controller 18 likewise determines the gradient current curves that lead to a sampling along the previously calculated sampling path when applied to the corresponding gradient coils with utilization of the DACs in the amplifiers 14.

If the computing power of the sequence controller 18 does not suffice for the inventive method, then the system computer 20 assumes the calculation of the k-space trajectory as well as the design of the gradient pulses required therefor and provides the sequence controller 18 with the result in the form of an edited dataset.

The inventive procedure for determining an optimum trajectory on the basis of a prescribed k-space occupancy taking the prescribed boundary conditions into consideration is explained on the basis of the following, simplified problems as examples which do not limit universal applications:

The problem of proceeding from a first k-space position $\vec{k}_0$ to a second k-space position $\vec{k}_1$ (see 23, 24 in FIG. 1A) in the context of k-space sampling is to be solved, first, under the boundary conditions that the Euclidean norm of both the gradient change rate (slew rate), i.e.

$$\|\dddot{k}\|_2 \leq \dddot{k}_{max}^2 \quad (1)$$

as well as the gradient amplitude, i.e.

$$\|\ddot{k}\|_2 \leq \ddot{k}_{max}^2 \quad (2)$$

is limited, and under the boundary condition that the sampling ensues as fast as possible. The minimization of the slew rate or avoiding nerve stimulations of the examination subject by limiting corresponding gradient pulse values also can be selected as further boundary condition. Physically, the limitation of both quantities to the Euclidean norm means that the geometry of this problem can be arbitrarily displaced in space and/or rotated without overloading the gradient amplifiers.

The present problem is solved with a calculus of variations calculation by solving the Hamilton equation underlying the problem using Lagrange multiplication taking the prescribed boundary conditions into consideration and a k-space trajectory equation of the sampling path is determined as a result.

The minimization of the sampling time requires an uninterrupted use of the entire available slew rate. The remaining task is thus to optimize the time function of the spatial slew rate direction.

In the two-dimensional case $\vec{k}=(x,y)$, the slew rate is unambiguously defined by its directional angle $\theta(t)$. After normalizing of the slew rate to 1, the position coordinates of the slew rate (equal to the second derivative with respect to time of the k-space position) can be presented in the following way:

$$\ddot{x}=\cos\theta, \ddot{y}=\sin\theta. \quad (3)$$

For clarity, the x-components or y-components of the corresponding vector in k-space $\vec{k}=(x,y)$ are represented as x and y and their time derivations are represented as $\dot{x},\dot{y}$ as well as $\ddot{k},\ddot{y}$.

First, let the simplest case be considered wherein a predetermined end position $(x_1,y_1)^T$ is to be approached with a likewise predetermined end velocity $(\dot{x}_1,\dot{y}_1)^T$ in a minimum time T from at rest $(\dot{x}_0=\dot{y}_0=0)$. Without limitation of the universality, the starting point is set at the coordinate origin: $x_0=y_0=0$.

The Hamilton function of the present calculus of variations calculation problem $$\min|T \quad (4)$$

under the above boundary conditions is $$H=\lambda_{\dot{x}}\cos\theta+\lambda_{\dot{y}}\sin\theta+\lambda_x\dot{x}+\lambda_y\dot{y} \quad (5)$$

The functional expanded by the Lagrange multipliers for the boundary conditions is $$\phi(T)=T+\nu_{\dot{x}}[\dot{x}(T)|-\dot{x}_1]+\nu_{\dot{y}}[\dot{y}(T)-\dot{y}_1]+\nu_x[x(T)-x_1]+\nu_y[y(T)-y_1] \quad (6)$$

The Euler-Lagrange equations thus are $$|\dot{\lambda}_{\dot{x}}=-H_{\dot{x}}=-\lambda_x \quad \dot{\lambda}_x=-H_x=0$$

$$|\dot{\lambda}_{\dot{y}}=-H_{\dot{y}}=-\lambda_y \quad \dot{\lambda}_y=-H_y=0 \quad (7)$$

and the condition for an optimum of the control angle $\theta(t)$ is $$0H_\theta=-\lambda_{\dot{x}}\sin\theta+\lambda_{\dot{y}}\cos\theta \quad (8)$$

The boundary conditions are obtained by integration of the Euler-Lagrange equations with adaptation of the integration constant to the boundary conditions of the function $$\lambda_{\dot{x}}(t)=|\phi_{\dot{x}}=\nu_{\dot{x}}+\nu_x(T-t) \quad \lambda_x(t)=\phi_x=\nu_x$$

$$\lambda_{\dot{y}}(t)=|\phi_{\dot{y}}=\nu_{\dot{y}}+\nu_y(T-t) \quad \lambda_y(t)=\phi_y=\nu_y \quad (9)$$

so that the relationship for the optimum control angle (optimum control law) reads as follows:

$$\tan\theta(t)=\frac{\nu_{\dot{y}}+\nu_y(T-t)}{\nu_{\dot{x}}+\nu_x(T-t)} \quad (10)$$

The constants $\nu_{\dot{x}}$, $\nu_{\dot{y}}$, $\nu_x$ and $\nu_y$ must be defined such that the four boundary conditions are adhered to.

The optimum, i.e. minimized, end time T satisfies the transversality condition $$0=\Omega=1+H(T) \quad (11)$$

or $$0=1+\nu_{\dot{x}}\cos\theta(T)+\nu_{\dot{y}}\sin\theta(T), \quad (12)$$

that corresponds to the optimum control law for t=T. The optimum control law can be brought into a simplified, more surveyable form by means of a coordinate transformation by the angle $\alpha$. With $$\bar{\theta}=\theta-\alpha,$$

then $$\tan\bar{\theta}(t)=\tan\bar{\theta}_0+\frac{\tan\bar{\theta}_1-\tan\bar{\theta}_0}{T}t=A+Bt \quad (13)$$

applies.

Upon introduction of a function $$ast\theta=Ar\sin h(\tan\theta) \quad (14)$$

the velocity components can, finally, be explicitly set forth as $$\bar{x}(t)=\int_0^t\frac{d\tau}{\sqrt{1+(A+B\tau)^2}}=\frac{ast\bar{\theta}-ast\bar{\theta}_0}{\tan\bar{\theta}-\tan\bar{\theta}_0}t \quad (15)$$

$$\bar{y}(t)=\int_0^t\frac{(A+B\tau)d\tau}{\sqrt{1+(A+B\tau)^2}}=\frac{\sec\bar{\theta}-\sec\bar{\theta}_0}{\tan\bar{\theta}-\tan\bar{\theta}_0}t \quad (16)$$

following integration, as can the location coordinates $$\bar{x}(t) = \frac{\tan\bar{\theta}(ast\bar{\theta} - ast\bar{\theta}_0) - \sec\bar{\theta} + \sec\bar{\theta}_0}{(\tan\bar{\theta} - \tan\bar{\theta}_0)^2}t^2 \quad (17)$$

$$\bar{y}(t) = \frac{ast\bar{\theta} - ast\bar{\theta}0 + \tan\bar{\theta}(\sec\bar{\theta} - \sec\bar{\theta}_0) - (\tan\bar{\theta} - \tan\bar{\theta}_0)\sec\bar{\theta}_0}{2(\tan\bar{\theta} - \tan\bar{\theta}_0)^2}t^2 \quad (18)$$

following another integration.

The right sides of the Equations (15), (16), (17) and (18) contain the four unknowns $\alpha, T, \theta_0$ and $\theta_1$ that, after insertion of the values $\bar{x}(T), \bar{y}(T), \bar{\dot{x}}(T)$ and $\bar{\dot{y}}(T)$ into the respective left sides of the Equations (15) through (18), can be numerically determined, for example by means of the Newton method.

After calculating these four unknowns, the k-space trajectory that is optimum with respect to the gradient rate of change (slew rate) and the gradient amplitude under the boundary conditions according to the Euclidean norms can be determined according to Equation (13). The calculated time T is then the minimum time in which the problem that has been posed can be solved.

The inventive method shall now be illustrated on the basis of FIGS. 1a, 1b, 1c and 1d.

Figure 1A:
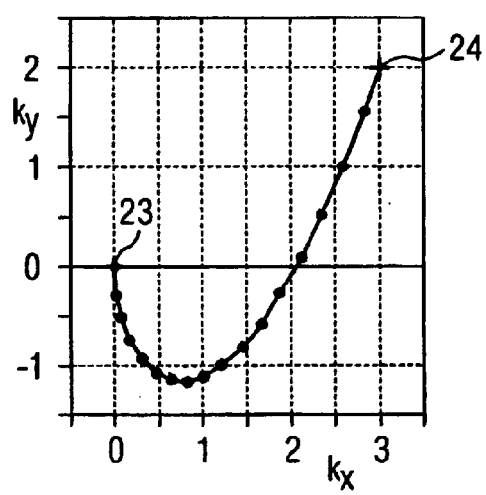
FIG. 1A shows two points of the k-matrix that are connected by an optimum k-space trajectory taking prescribed boundary conditions into consideration.

Two points 23, 24 of the k-matrix are given in FIG. 1a, a start point 23 $\vec{k}_0 = (0,0)$ as well as an end point 24 $\vec{k}_1 = (3,2)$, that—as explained above—are to be connected in the shortest possible time by a suitable pulse sequence to be calculated (defined by the gradient change and the gradient amplitude). The boundary conditions of this task are the Euclidean norms as upper limit values for the gradient rate of change and the gradient amplitude. Additionally, the velocities in the two points 23, 24 are given, $\bar{\dot{k}}_0 = (0,0)$ as well as $\bar{\dot{k}}_1 = (1,2.5)$ in this case.

The Equations (15) through (18) can be numerically solved by means of these four given values as well as the limit values. As a result, an equation of the optimized k-space trajectory can be produced according to (13).

The derived k-space trajectory in FIG. 1a has a shape similar to a parabola. For illustration, it should be noted that the trajectory would simply be the connecting straight line between the points $\vec{k}_0$, 23 and $\vec{k}_1$, 24 without the given boundary conditions at $\bar{\dot{k}}_0$ and $\bar{\dot{k}}_1$.

Figure 1B:
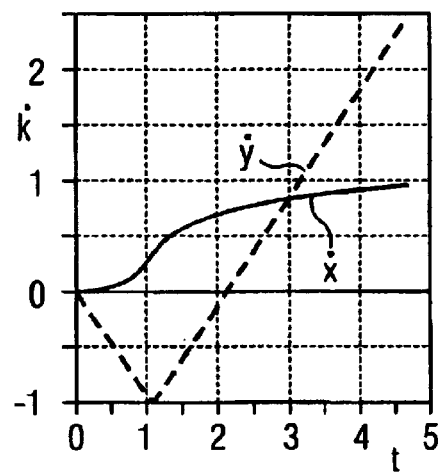
FIG. 1B shows the time curve of the two velocity components in the x-direction and the y-direction of the optimum k-space trajectory that corresponds to the gradient pulses to be applied and that are necessary in order to obtain a k-space sampling according to this trajectory.

The time derivatives of the x-components and y-components of the k-space trajectory are entered in FIG. 1b. Since the time derivative of the trajectory k is linked to the gradient amplitude G via the following equation $$\dot{k} = \gamma G \quad (19),$$

FIG. 1b represents the gradient pulses of the frequency encoding gradient $G_x$ and of the phase encoding gradient $G_y$ required for generating the calculated k-space trajectory. As can be seen, the two gradient pulse trains are neither trapezoidal nor sinusoidal but have a new shape. The bend of the phase encoding gradient at t=1 is a soft change in direction, as can be recognized on the basis of the steadiness of the y-component of the slew rate entered in FIG. 1C.

Figure 1C:
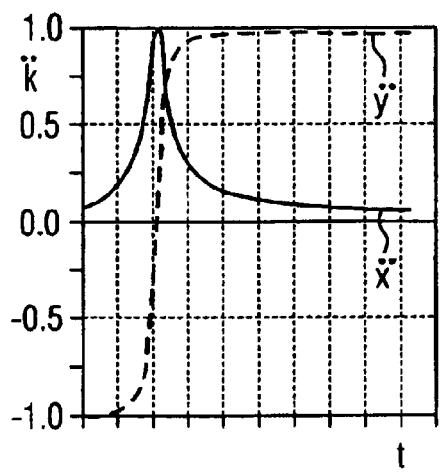
FIG. 1C shows the time curve of the two acceleration components in the x-direction and the y-direction of the optimum k-space trajectory that corresponds to the gradient slew rate of the gradient pulses and that are necessary in order to obtain a k-space sampling according to this trajectory.
Figure 1D:
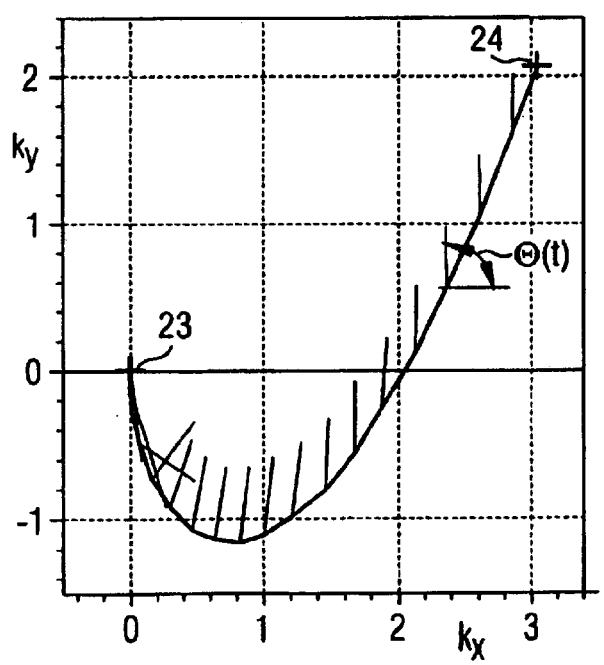
FIG. 1D shows the angle-dependency of the acceleration (slew rate) that must be applied during the sampling event in order to affect a sampling along this optimum trajectory.
Figure 2A:
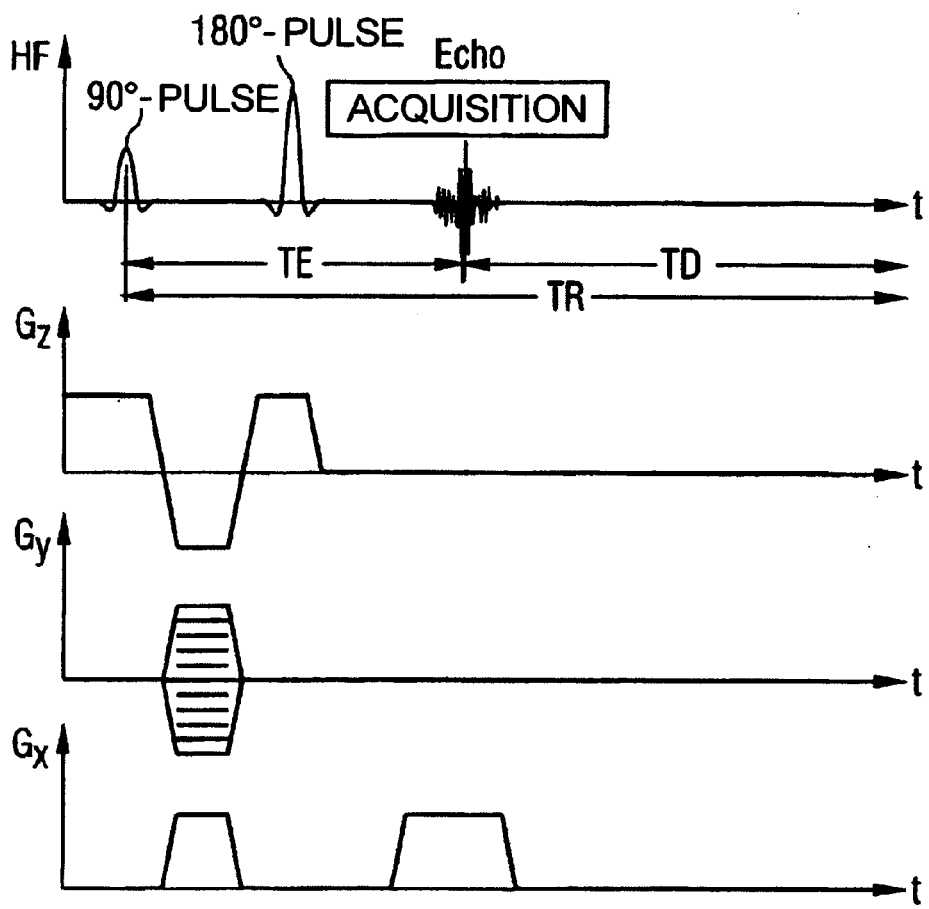
FIG. 2A schematically shows the time curve of the gradient pulse current functions of a spin-echo sequence.
Figure 2B:
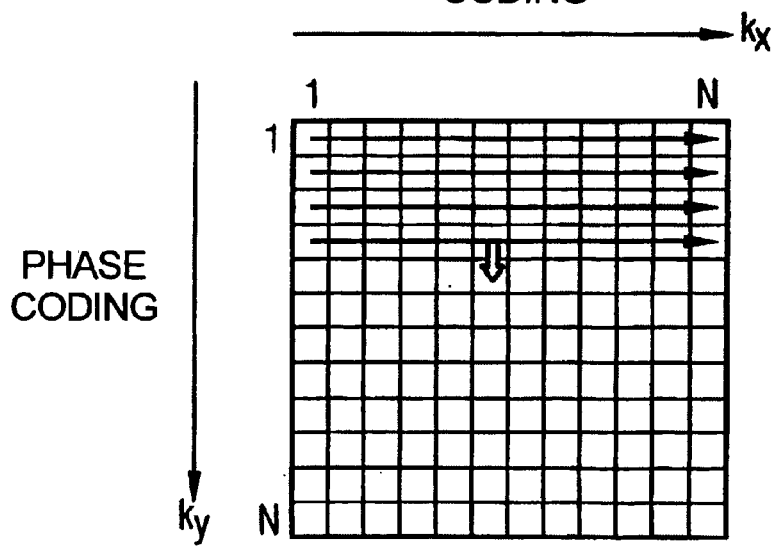
FIG. 2B schematically shows the time sampling of the k-matrix for a spin-echo sequence according to FIG. 1A.
Figure 4A:
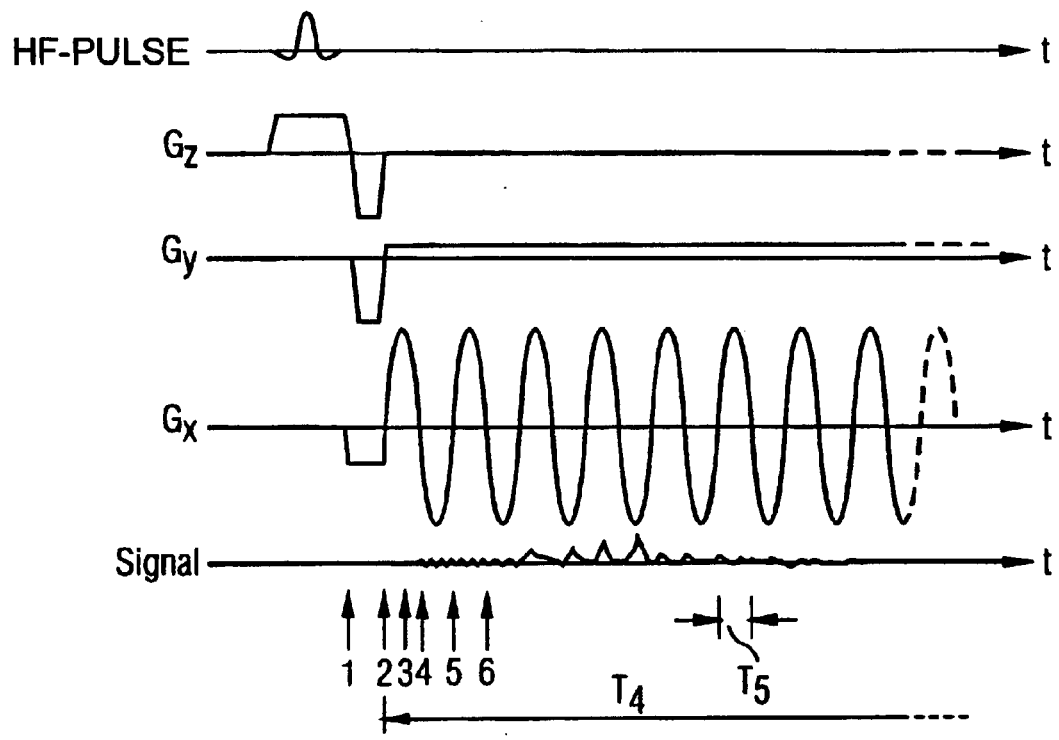
FIG. 4A schematically shows the time curve of the gradient pulse current functions of an echo-planar imaging sequence with a sinusoidal readout gradient.
Figure 4B:
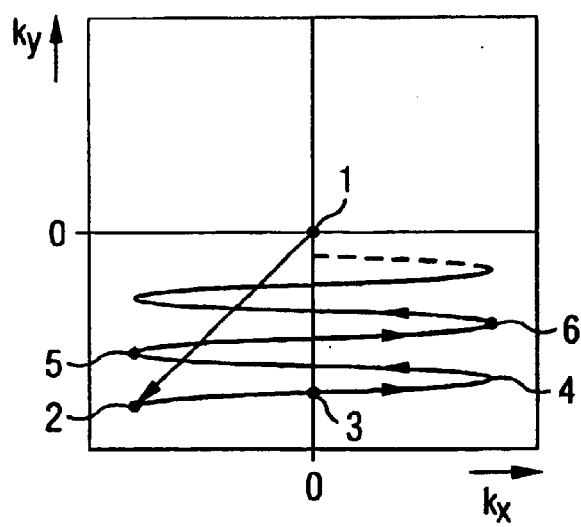
FIG. 4B schematically shows the time sampling of the k-matrix for an echo-planar imaging sequence according to FIG. 3A.

FIG. 1C can be obtained either by derivation of the curves of FIG. 1B or by combining Equation (13) with Equation (3). FIG. 1C thus represents the accelerations of the k-space trajectory divided into its respective components. Physically viewed, the two curves in FIG. 1C are the gradient rate of change (slew rates) of the respective gradient pulses. The directional dependency of the slew rate established by the angle $\theta(t)$ is shown in FIG. 1D.

Further versions and expansions of the present invention shall be discussed below.

For example, it can be of interest to minimize the slew rate $\dot{G} = \ddot{k}/\gamma$ or its components instead of the run time T. In this case, T is given and Equation (3) is multiplied by a factor, for example s, $$\ddot{x} = s\cos\theta, \ \ddot{y} = s\sin\theta \quad (3')$$

that likewise appears as such in Equations (15) through (18) and for which the solution is ultimately sought.

A first expansion of the above optimization problem is represented by a k-space trajectory to be determined having a start point at $\vec{k}_0 = (x_0; y_0)^T$ that is different from the coordinate origin and that has an initial velocity $\bar{\dot{k}}_o$ at the start point $\bar{k}_0$. Both the coordinates of the start point x0, y0 as well as the initial velocity $\bar{\dot{k}}_0$ must be taken into consideration in the integration of the motion equations. The general form of the solution then corresponds to that of the problem with a start from the origin, with the difference that the Equations (15) through (18) has integration constants $\bar{x}_0, \bar{y}_0, \bar{\dot{x}}_0, \bar{\dot{y}}_0$ that are given by the known coordinates of the start point as well as due to the known initial velocity.

A second expansion of the problem underlying the invention is to generalize the course of the k-space trajectory to be optimized to the three-dimensional case. In this expanded case, two control angles $\theta(t)$ and $\phi(t)$ are required for describing the trajectory and its derivatives. After norming the slew rate to 1, the two time derivatives of the position coordinates are $$\ddot{x} = \cos\theta\sin\phi, \ \ddot{y} = \sin\theta\sin\phi, \ \ddot{z} = \cos\phi \quad (20)$$

After formation of the Hamilton function and determination of the Euler-Lagrange equations, the control law optimized taking all boundary conditions into consideration can be represented as follows:

$$\tan\theta(t) = \frac{v_{\dot{y}} + v_y(T-t)}{v_{\dot{x}} + v_x(T-t)} \quad (21)$$

$$\tan\phi(t) = \frac{\sqrt{(v_{\dot{x}} + v_x(T-t))^2 + (v_{\dot{y}} + v_y(T-t))^2}}{v_{\dot{z}} + v_z(T-t)}$$

As a result of algebraic reshaping, a symmetrical Cartesian representation of the slew rate/time functions is:

$$\ddot{x} = \frac{v_{\dot{x}} + v_x(T-t)}{\sqrt{(v_{\dot{x}} + v_x(T-t))^2 + [v_{\dot{y}} + v_y(T-t)]^2 + [v_{\dot{z}} + v_z(T-t)]^2}} \quad (22)$$

$$\ddot{y} = \frac{v_{\dot{y}} + v_y(T-t)}{\sqrt{(v_{\dot{x}} + v_x(T-t))^2 + [v_{\dot{y}} + v_y(T-t)]^2 + [v_{\dot{z}} + v_z(T-t)]^2}}$$

$$\ddot{z} = \frac{v_{\dot{z}} + v_z(T-t)}{\sqrt{(v_{\dot{x}} + v_x(T-t))^2 + [v_{\dot{y}} + v_y(T-t)]^2 + [v_{\dot{x}} + v_x(T-t)]^2}}.$$

These can be integrated twice closed by means of the following auxiliary integrals:

$$\int \frac{et+f}{\sqrt{at^2+bt+c}} dt = \frac{e}{a}\sqrt{at^2+bt+c} + \frac{2af-be}{2a\sqrt{a}} \text{Arsinh} \frac{2at+b}{\sqrt{4ac-b^2}} \quad (23)$$

$$\int \sqrt{at^2+bt+c}\, dt = \frac{2at+b}{4a}\sqrt{at^2+bt+c} + \frac{4ac-b^2}{8a\sqrt{a}} \text{Arsinh} \frac{2at+b}{\sqrt{4ac-b^2}}$$

$$\int \text{Arsinh}(at+b) dt = \frac{at+b}{a} \text{Arsinh}(at+b) - \frac{\sqrt{1+(at+b)^2}}{a}$$

Similar time functions as in the two-dimensional case follow therefrom for the components $\dot{x}$, $\dot{y}$ and $\dot{z}$ as well as x, y and z, which can likewise be numerically solved for the unknowns $v_{\dot{x}}$, $v_x$, $v_{\dot{y}}$, $v_y$, $v_{\dot{z}}$ and $v_z$. An insertion of these values into the Equations (21) then yields the path equations of the optimized, three-dimensional k-space trajectory.

The method as just presented describes the determination of the sampling path between only two points. In order to obtain the sampling path of the entire k-matrix which generally contains more than only two measuring points (for example, 256×256), the algorithm that has just been described must be implemented for each pair of measuring points that are adjacent due to sampling. As stated, this ensues in the sequence controller 18 in the system computer 20.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for calculating a sampling path of a k-matrix obtained using a magnetic resonance tomography apparatus having gradient coils operated by sequence controller and a system computer, comprising the steps of:
    entering at least one boundary condition for a magnetic resonance tomography measurement into one of said sequence controller and a said system computer of said magnetic resonance tomography apparatus;
    dependent on said at least one boundary condition, calculating a sampling path, having a non-predefined curve shape, for a k-matrix of said magnetic resonance tomography measurement in one of said sequence controller and said system computer by a calculus of variations calculation that includes forming a Hamilton function; and
    in one of said sequence controller and said system computer, determining gradient current curves in said magnetic resonance measurement which produce the calculated sampling path when respectively applied to said gradient coils of said magnetic resonance tomography apparatus.

2. A method as claimed in claim 1 wherein said magnetic resonance tomography apparatus has a basic field magnet with a homogeneity volume and a gradient amplifier for operating one of said gradient coils, and wherein the step of entering at least one boundary condition comprises entering a boundary condition representing a maximum loadability of said gradient amplifier for arbitrary rotation of said k-matrix in said homogeneity volume of said basic field magnet.

3. A method as claimed in claim 1 wherein said magnetic resonance tomography apparatus has a basic field magnet having a homogeneity volume and a gradient amplifier for operating one of said gradient coils, and comprising storing a boundary condition in a memory representing a maximum loadability of said gradient amplifier for arbitrary rotation of said k-matrix in said homogeneity volume of said basic field magnet, and wherein the step of entering said at least one boundary condition comprises calling said maximum loadability from said memory.

4. A method as claimed in claim 1 wherein said magnetic resonance tomography measurement is conducted on an examination subject, and wherein the step of entering said at least one boundary condition comprises entering a boundary condition representing a spatial orientation of said k-matrix in said examination subject.

5. A method as claimed in claim 1 wherein said k-matrix comprises a plurality of measuring points obtained during said magnetic resonance tomography measurement, and wherein the step of entering at least one boundary condition comprises entering a boundary condition representing an arrangement of said measuring points in said k-matrix.

6. A method as claimed in claim 1 wherein the step of entering at least one boundary condition comprises entering a boundary condition representing a sequence type for sampling said k-matrix.

7. A method as claimed in claim 1 wherein said k-matrix comprises a plurality of measuring points obtained during said magnetic resonance tomography measurement, and wherein the step of entering at least one boundary condition comprises entering a boundary condition representing respective departure and arrival speeds of each of said measuring points of said k-matrix.

8. A method as claimed in claim 1 wherein said k-matrix comprises a plurality of measuring points obtained during said magnetic resonance tomography measurement, and wherein the step of entering at least one boundary condition comprises entering a boundary condition representing a sequence with which said measuring points of said k-matrix are sampled.

9. A method as claimed in claim 1 wherein said magnetic resonance tomography measurement is conducted on an examination subject, and wherein the step of entering at least one boundary condition comprises entering a boundary condition representing limit values for said gradient pulses to avoid nerve stimulation of said examination subject.

10. A method as claimed in claim 1 wherein said k-matrix is sampled using said sampling path with an associated sampling time, and wherein the step of entering at least one boundary condition comprises entering a boundary condition representing a minimization of said sampling time.

11. A method as claimed in claim 1 wherein said k-matrix is sampled using said sampling path with an associated slew rate, and wherein the step of entering said at least one boundary condition comprises entering a boundary condition representing a minimization of said slew rate.

12. A method as claimed in claim 1 wherein the step of entering at least one boundary condition comprises entering a plurality of boundary conditions, and wherein the step of calculating said sampling path comprises executing said calculus of variations calculation using all of said boundary conditions.

13. A method as claimed in claim 1 wherein the step of entering at least one boundary condition comprises entering a plurality of boundary conditions, and wherein the step of calculating said sampling path comprises executing said calculus of variations calculation using a subset of said boundary conditions.

14. A method as claimed in claim 1 wherein the step of calculating a sampling path comprises calculating a two-dimensional sampling path.

15. A method as claimed in claim 1 wherein the step of calculating a sampling path comprises calculating a three-dimensional sampling path.

16. A method as claimed in claim 12 wherein the step of calculating said sampling path by said calculus of variations calculation using all of said boundary conditions comprises defining said Hamilton function dependent on said boundary conditions, and solving a differential equation based on said Hamiltonian function using Lagrange multiplication to obtain an equation representing said sampling path.

17. A method as claimed in claim 13 wherein the step of calculating said sampling path by said calculus of variations calculation using a subset of said boundary conditions comprises defining said Hamilton function dependent on said boundary conditions, and solving a differential equation based on said Hamilton function using Lagrange multiplication to obtain an equation representing said sampling path.

18. A magnetic resonance apparatus, comprising:
a magnetic resonance scanner, having a plurality of gradient coils, for executing a magnetic resonance tomography measurement controlled by a system computer and a sequence controller;
an input unit allowing entry of at least one boundary condition for said magnetic resonance tomography measurement into one of said sequence controller and said system computer;
said one of said sequence controller and said system computer, dependent on said at least one boundary condition, calculating a sampling path, having a non-predefined curve shape, for a k-matrix of said magnetic resonance tomography measurement by a calculus of variations calculation that includes forming a Hamilton function; and
said one of said sequence controller and said system computer determining gradient current curves in said magnetic resonance tomography measurement which produce the calculated sampling path when respectively applied to said gradient coils of said magnetic resonance tomography apparatus.

19. A magnetic resonance apparatus as claimed in claim 18 comprising a basic field magnet with a homogeneity volume and a gradient amplifier for operating one of said gradient coils, and wherein said boundary condition represents a maximum loadability of said gradient amplifier for arbitrary rotation of said k-matrix in said homogeneity volume of said basic field magnet.

20. A magnetic resonance apparatus as claimed in claim 18 comprising a basic field magnet having a homogeneity volume and a gradient amplifier for operating one of said gradient coils, and a memory in which a boundary condition is stored representing a maximum loadability of said gradient amplifier for arbitrary rotation of said k-matrix in said homogeneity volume of said basic field magnet, and wherein said input unit, responsive to said entry, calls said maximum loadability from said memory.

21. A magnetic resonance apparatus as claimed in claim 18 wherein said magnetic resonance tomography examination is conducted on an examination subject, and wherein said boundary condition represents a spatial orientation of said k-matrix in said examination subject.

22. A magnetic resonance apparatus as claimed in claim 18 wherein said k-matrix comprises a plurality of measuring points obtained by said scanner during said magnetic resonance tomography examination, and wherein said boundary condition represents an arrangement of said measuring points in said k-matrix.

23. A magnetic resonance apparatus as claimed in claim 18 wherein said boundary condition represents a sequence type for sampling said k-matrix.

24. A magnetic resonance apparatus as claimed in claim 18 wherein said k-matrix comprises a plurality of measuring points obtained during said magnetic resonance tomography examination, and wherein said boundary condition represents respective departure and arrival speeds of each of said measuring points of said k-matrix.

25. A magnetic resonance apparatus as claimed in claim 18 wherein said k-matrix comprises a plurality of measuring points obtained during said magnetic resonance tomography measurement, and wherein said a boundary condition represents a sequence with which said measuring points of said k-matrix are sampled.

26. A magnetic resonance apparatus as claimed in claim 18 wherein said magnetic resonance tomography measurement is conducted on an examination subject, and wherein said a boundary condition represents limit values for said gradient pulses to avoid nerve stimulation of said examination subject.

27. A magnetic resonance apparatus as claimed in claim 18 wherein said k-matrix is sampled with a sampling time associated therewith, and wherein said boundary condition represents a minimization of said sampling time.

28. A magnetic resonance apparatus as claimed in claim 18 wherein said k-matrix is sampled with a slew rate associated therewith, and wherein said boundary condition represents a minimization of said slew rate.

29. A magnetic resonance apparatus as claimed in claim 18 wherein said input unit allows entry of a plurality of boundary conditions, and wherein said one of said sequence controller and said system computer calculates said sampling path by executing said calculus of variations calculation using all of said boundary conditions.

30. A magnetic resonance apparatus as claimed in claim 18 wherein said input unit allows entry of a plurality of boundary conditions, and wherein said one of said sequence controller and said system computer calculates said sampling path by executing said calculus of variations calculation using a subset of said boundary conditions.

31. A magnetic resonance apparatus as claimed in claim 18 wherein said one of said sequence controller and said system computer calculates a two-dimensional sampling path.

32. A magnetic resonance apparatus as claimed in claim 18 wherein said one of said sequence controller and said system computer calculates a three-dimensional sampling path.

33. A magnetic resonance apparatus as claimed in claim 29 wherein said one of said sequence controller and said system controller calculates said sampling path by said calculus of variations calculation using all of said boundary conditions by defining said Hamilton function dependent on said boundary conditions, and solving a differential equation based on said Hamilton function using LaGrange multiplication to obtain an equation representing said sampling path.

34. A magnetic resonance apparatus as claimed in claim 30 wherein said one of said sequence controller and said system controller calculates said sampling path by said calculus of variations calculation using a subset of said boundary conditions by defining a differential equation based on aid Hamilton function dependent on said boundary conditions, and solving said Hamilton equation using LaGrange multiplication to obtain an equation representing said sampling path.

35. A method for calculating a sampling path of a k-matrix obtained using a magnetic resonance tomography apparatus having gradient coils operated by sequence controller and a system computer, comprising the steps of:

entering at least one boundary condition for a magnetic resonance tomography measurement into one of said sequence controller and said system computer of said magnetic resonance tomography apparatus;

dependent on said at least one boundary condition, calculating a sampling path, unconstrained by a predefined curve shape, for a k-matrix of said magnetic resonance tomography measurement in one of said sequence controller and said system computer by a calculus of variations calculation that includes forming a Hamilton function; and in one of said sequence controller and said system computer, determining gradient current curves in said magnetic resonance measurement which produce the calculated sampling path when respectively applied to said gradient coils of said magnetic resonance tomography apparatus.

36. A magnetic resonance apparatus, comprising:

a magnetic resonance scanner, having a plurality of gradient coils, for executing a magnetic resonance tomography measurement controlled by a system computer and a sequence controller;

an input unit allowing entry of at least one boundary condition for said magnetic resonance tomography measurement into one of said sequence controller and said system computer;

said one of said sequence controller and said system computer, dependent on said at least one boundary condition, calculating a sampling path, unconstrained by a predefined curve shape, for a k-matrix of said magnetic resonance tomography measurement by a calculus of variations calculation that includes forming a Hamilton function; and said one of said sequence controller and said system computer determining gradient current curves in said magnetic resonance tomography measurement which produce the calculated sampling path when respectively applied to said gradient coils of said magnetic resonance tomography apparatus.

* * * * *